United States Patent
Song et al.

(10) Patent No.: US 11,006,525 B2
(45) Date of Patent: May 11, 2021

(54) DISPLAY DEVICE AND METHOD OF MANUFACTURING THE SAME

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Dexiong Song, Beijing (CN); Zhiyong Yang, Beijing (CN); Kaimin Wang, Beijing (CN); Dongpan Yao, Beijing (CN); Gong Chen, Beijing (CN); Chengyi Li, Beijing (CN); Guangjie Yang, Beijing (CN); Jiming Zhang, Beijing (CN); Caihua Cheng, Beijing (CN); Yu Du, Beijing (CN); Xuemei Deng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/399,231

(22) Filed: Apr. 30, 2019

(65) Prior Publication Data
US 2020/0092997 A1 Mar. 19, 2020

(30) Foreign Application Priority Data

Sep. 17, 2018 (CN) .......................... 201811083899.2

(51) Int. Cl.
*H05K 1/11* (2006.01)
*H05K 1/14* (2006.01)
(Continued)

(52) U.S. Cl.
CPC ............. *H05K 1/147* (2013.01); *H01L 51/56* (2013.01); *H05K 3/361* (2013.01); *H05K 5/0017* (2013.01);
(Continued)

(58) Field of Classification Search
USPC .......................................................... 361/784
See application file for complete search history.

(56) References Cited

U.S. PATENT DOCUMENTS 7,593,085 B2  9/2009  Watanabe et al.
7,903,182 B2  3/2011  Ishii et al.
(Continued)

FOREIGN PATENT DOCUMENTS

CN  101387769 A  3/2009
CN  102608793 A  7/2012
(Continued)

OTHER PUBLICATIONS

First Chinese Office Action dated Nov. 26, 2021, received for corresponding Chinese Application No. 201811083899.2, 12 pages.

*Primary Examiner* — Andargie M Aychillhum
(74) *Attorney, Agent, or Firm* — Kinney & Lange, P.A.

(57) ABSTRACT

A display device and a method of manufacturing the same are provided. The display device includes a display panel having a display region and a non-display region that are divided in a plane where a light-emitting surface of the display panel is located, a drive circuit plate being disposed on the non-display region; a light transmission layer which is extended from the display region to above the drive circuit plate within the non-display region and has an opening, the opening being adjacent to a boundary of the drive circuit plate close to the display region and being disposed on a side of the drive circuit plate close to the display region.

17 Claims, 7 Drawing Sheets

(51) Int. Cl.
  *H01L 51/56* (2006.01)
  *H05K 3/36* (2006.01)
  *H05K 5/00* (2006.01)
  *G02F 1/1335* (2006.01)
  *G02F 1/1345* (2006.01)
  *H01L 27/32* (2006.01)
  *H01L 51/52* (2006.01)

(52) U.S. Cl.
  CPC ...... *G02F 1/13452* (2013.01); *G02F 1/13454* (2013.01); *G02F 1/133512* (2013.01); *G02F 1/133528* (2013.01); *H01L 27/3272* (2013.01); *H01L 27/3276* (2013.01); *H01L 51/5246* (2013.01); *H01L 51/5281* (2013.01); *H01L 51/5284* (2013.01); *H05K 2201/10128* (2013.01); *H05K 2201/10136* (2013.01)

(56) References Cited

U.S. PATENT DOCUMENTS

| | | |
|---|---|---|
| 8,004,620 B2 | 8/2011 | Ishii et al. |
| 10,670,917 B2 | 6/2020 | Yasunaga et al. |
| 10,884,299 B2 | 1/2021 | Zhu et al. |
| 2007/0013856 A1 | 1/2007 | Watanabe et al. |
| 2009/0066862 A1 | 3/2009 | Ishii et al. |
| 2010/0157218 A1 | 6/2010 | Ishii et al. |
| 2013/0135829 A1 | 5/2013 | Lee |
| 2016/0161664 A1* | 6/2016 | Ishida ............... G02B 6/00 359/230 |
| 2019/0072822 A1* | 3/2019 | Yasunaga ......... G02B 6/0035 |
| 2019/0271892 A1 | 9/2019 | Zhu et al. |

FOREIGN PATENT DOCUMENTS

| | | |
|---|---|---|
| CN | 104777943 A | 7/2015 |
| CN | 205827006 U | 12/2016 |
| CN | 107121822 A | 9/2017 |
| CN | 107491207 A | 12/2017 |
| TW | 200702804 A | 1/2007 |
| WO | 2017061312 A1 | 4/2017 |

* cited by examiner

DISPLAY DEVICE AND METHOD OF MANUFACTURING THE SAME

CROSS-REFERENCE TO RELATED APPLICATION

This application claims the benefit of Chinese Patent Application No. 201811083899.2, filed with the State Intellectual Property Office of China on Sep. 17, 2018, the whole disclosure of which is incorporated herein by reference.

TECHNICAL FIELD

The present disclosure relates to the field of display technology, and in particular, to a display device and a method of manufacturing the same.

BACKGROUND

A flexible substrate of a flexible display panel may be bent or even folded, and can accordingly be easier to carry, or even be worn by consumers as a flexible display device on their bodies.

Usually, there is a thickness difference in a side surface of a FPC (Flexible Printed Circuit) since the FPC has a certain thickness. When forming a bonding layer, the bonding layer cannot be completely attached to the side surface of the FPC. A light leakage will occur if the light is emitted from a region within the visible area other than the operable region, thereby adversely affecting the user experience.

SUMMARY

According to an aspect of the present disclosure, there is provided a display device comprising a display panel having a display region and a non-display region that are divided in a plane where a light-emitting surface of the display panel is located, a drive circuit plate being disposed on the non-display region; a light transmission layer which is extended from the display region to above the drive circuit plate within the non-display region and has an opening, the opening being adjacent to a boundary of the drive circuit plate close to the display region and being disposed on a side of the drive circuit plate close to the display region.

According to some embodiments of the present disclosure, the opening has a first sidewall that is abutted a side surface of the drive circuit plate close to the display region.

According to some embodiments of the present disclosure, the opening has a maximum width ranged from about 0.25 mm to about 0.5 mm in a direction from the display region to the non-display region.

According to some embodiments of the present disclosure, the first sidewall of the opening and the light-emitting surface of the display panel form an angle ranging from 45° to 135°.

According to some embodiments of the present disclosure, the opening is filled therein with a light shielding structure.

According to some embodiments of the present disclosure, the display panel further comprises, in a thickness direction, an array substrate and an opposite substrate on the array substrate, wherein the drive circuit plate is on the array substrate and is spaced from the opposite substrate on a side of the opposite substrate away from the display region, the light transmission layer is extended from the opposite substrate to above the drive circuit plate and completely covers a boundary of the opposite substrate close to the display region.

According to some embodiments of the present disclosure, the opening has a second sidewall that is close to a boundary of the opposite substrate close to the drive circuit plate, and at least a portion of the second sidewall is inclined with respect to the light-emitting surface of the display panel.

According to some embodiments of the present disclosure, in a direction from the display region to the non-display region, the opposite substrate is opposite to the drive circuit plate, and the first sidewall of the opening is opposite to the second sidewall.

According to some embodiments of the present disclosure, the display panel comprises, in a thickness direction, an array substrate and an opposite substrate on the array substrate, wherein the drive circuit plate is on the opposite substrate, and the light transmission layer is extended from the opposite substrate to above the drive circuit plate.

According to some embodiments of the present disclosure, in a direction from the display region to the non-display region, the opening has a second sidewall that is opposite to the first sidewall, and at least a portion of the second sidewall is inclined with respect to the light-emitting surface of the display panel.

According to some embodiments of the present disclosure, the display panel further comprises, in a thickness direction, an array substrate and an opposite substrate on the array substrate; the display panel further comprising two said drive circuit plates and two said openings, wherein one drive circuit plate of the two drive circuit plates is on the opposite substrate, the other drive circuit plate of two drive circuit plates is on the array substrate and is spaced from the opposite substrate; the light transmission layer is extended above the array substrate, the opposite substrate and the drive circuit plates and completely covers a boundary of the opposite substrate close to the other drive circuit plate.

According to some embodiments of the present disclosure, the one drive circuit plate on the opposite substrate and the other drive circuit plate on the array substrate are located on opposite sides of the display panel.

According to some embodiments of the present disclosure, the light transmission layer is a polarizer, or the light transmission layer is an optical transparent adhesive.

According to some embodiments of the present disclosure, the light transmission layer is a polarizer, or the light transmission layer is an optical transparent adhesive.

According to another aspect of the present disclosure, there is provided a method of manufacturing a display device comprising a display panel having a display region and a non-display region that are divided in a plane where a light-emitting surface of the display panel is located, the method comprises steps as follows:

forming a drive circuit plate within the non-display region of a base substrate of the display panel;

forming a light transmission layer which is extended from the display region to above the drive circuit plate within the non-display region and has an opening, the opening being adjacent to a boundary of the drive circuit plate close to the display region and being disposed on a side of the drive circuit plate close to the display region, wherein the opening has a first sidewall that is abutted a side surface of the drive circuit plate close to the display region.

According to some embodiments of the present disclosure, forming a light transmission layer comprises:

bonding the light transmission layer with the opening onto the base substrate with the drive circuit plate.

According to some embodiments of the present disclosure, forming a light transmission layer comprises:

forming, by a coating process or a deposition process, a light transmission film on the base substrate with the drive circuit plate, and then, exposing and developing the light transmission film to form the opening.

According to some embodiments of the present disclosure, the opening has a maximum width ranged from about 0.25 mm to about 0.5 mm in a direction from the display region to the non-display region.

According to some embodiments of the present disclosure, the method further comprises: filling the opening with a light shielding structure.

Figure 1:
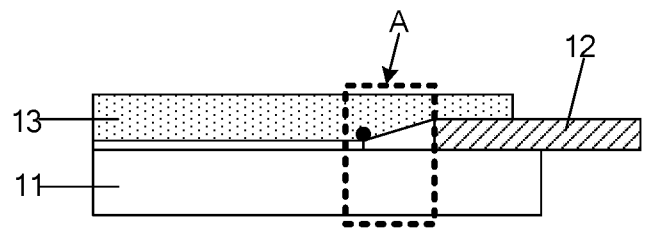
FIG. 1 is a side schematic view of a display device in related art.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

The technical solutions in the embodiments of the present disclosure will be clearly and completely described in the following with reference to the accompanying drawings. It is obvious that the described embodiments are only some of the embodiments of the present disclosure, instead of all of the embodiments. All other embodiments obtained by those skilled in the art based on the embodiments of the present disclosure without any inventive works fall into the scope of the present disclosure.

In a display device of related art, a FPC (flexible circuit board) is usually placed on a side of an array substrate close to an opposite substrate, and the FPC is bent to a surface of another side of the array substrate. If a base substrate of the array substrate is of a flexible material, the base substrate of the array substrate is also bent as the FPC is bent. Therefore, as shown in FIG. 1, it is usual that the FPC 12 is fixed onto the array substrate 11 by a bonding layer 13, after that, the bending of the FPC 12 is performed.

Figure 2:
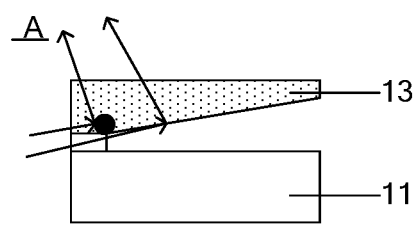
FIG. 2 is an enlarged schematic view of an area A shown in FIG. 1.

However, as shown in FIG. 2, when forming the bonding layer 13, there is a thickness difference in the side surface of the FPC 12 since the FPC has a certain thickness, that is, the bonding layer 13 cannot be completely attached to the side surface of the FPC 12, so that a portion of the surface of the bonding layer 13 at the side surface of the FPC forms a bevel. A projection of the bevel on the flexible base substrate has a large width of 0.6 mm to 1 mm. Due to the process factors, on the other hand, the bevel is uneven, so that some of the large-angle light emitted from the display region of the display panel is reflected diffusely by the bevel after being incident onto the bevel. Some of the light is incident on a visible area, and may be emitted out from the visible area since it is not blocked by the ink in an ink area.

However, because only an operable region within the visible area is used for display, a light leakage will occur if the light is emitted from a region within the visible area other than the operable region, thereby adversely affecting the user experience.

According to embodiments of the present disclose, there is provided a display panel. Referring to FIGS. 3-10 and 13, the display panel is divided into a display region and a non-display region, the non-display region includes a binding area. The display panel further comprises a drive circuit plate 24 bound in the binding area, a light transmission layer 23 extended from the display region to above the drive circuit plate 24. The light transmission layer 23 covers the drive circuit plate 24. A portion of the light transmission layer 23 covering the drive circuit plate 24 is named as a first portion 231. The light transmission layer 23 comprises an opening disposed on a side of the drive circuit plate 24 close to the display region. One sidewall of the opening is formed by a boundary of the drive circuit plate 24 close to the display region and a boundary of the first portion 231 close to the display region.

It should be noted that the drive circuit plate 24 is used for connecting to a printed circuit board (PCB for short). The drive circuit plate 24 that is bendable itself may be, for example, a chip on film (COF for short), a tape carrier package (TCP for short), or a FPC with a drive integrated circuit (drive IC for short).

The display device may be a liquid crystal display or an OLED (Organic Light-Emitting Diode) display.

When the display device is a liquid crystal display, a backlight provides a light source for display. A display panel includes an array substrate 21, an opposite substrate (i.e. an assembly substrate) 22, and a liquid crystal layer disposed therebetween. The array substrate 21 may include a TFT (Thin Film Transistor) and a pixel electrode electrically connected to a drain of the TFT. It may further include a common electrode. The opposite substrate 22 may include a black matrix and a color film. Here, the color film may be either on the opposite substrate 22 or on the array substrate 21; the common electrode may be either on the array substrate 21 or on the opposite substrate 22. Based on the above, the liquid crystal display device may also include polarizers disposed on sides of the display panel close to and away from the backlight respectively.

When the display device is an OLED display, since the OLED display is a self-illuminating device, the light source for display is provided by itself. The OLED display includes an array substrate 21 and an opposite substrate (namely, a package substrate) 22. The array substrate 21 may include a TFT, an anode electrically connected to a drain of the TFT, a cathode, and an organic material functional layer between the anode and the cathode.

Figure 3:
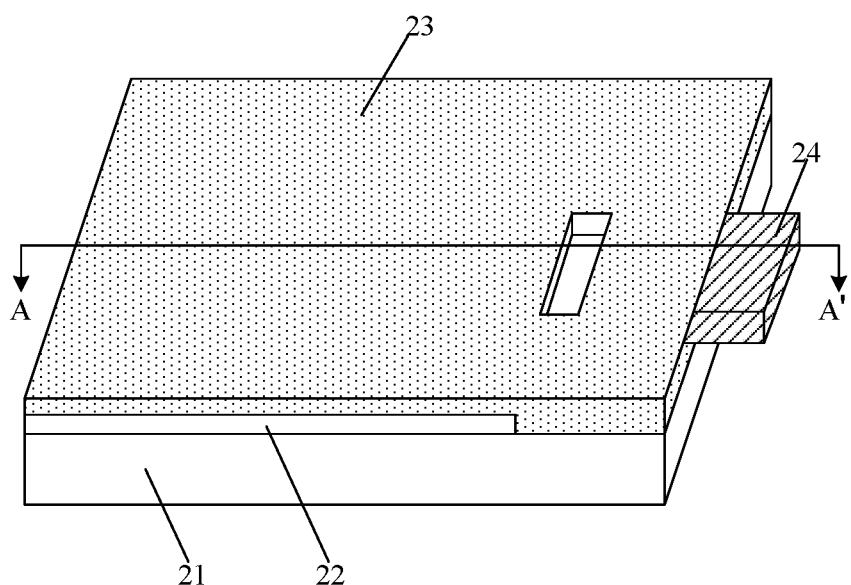
FIG. 3 is a perspective schematic view of a display device according to an embodiment of the present disclosure, in which a drive circuit plate is on an array substrate.
Figure 7:
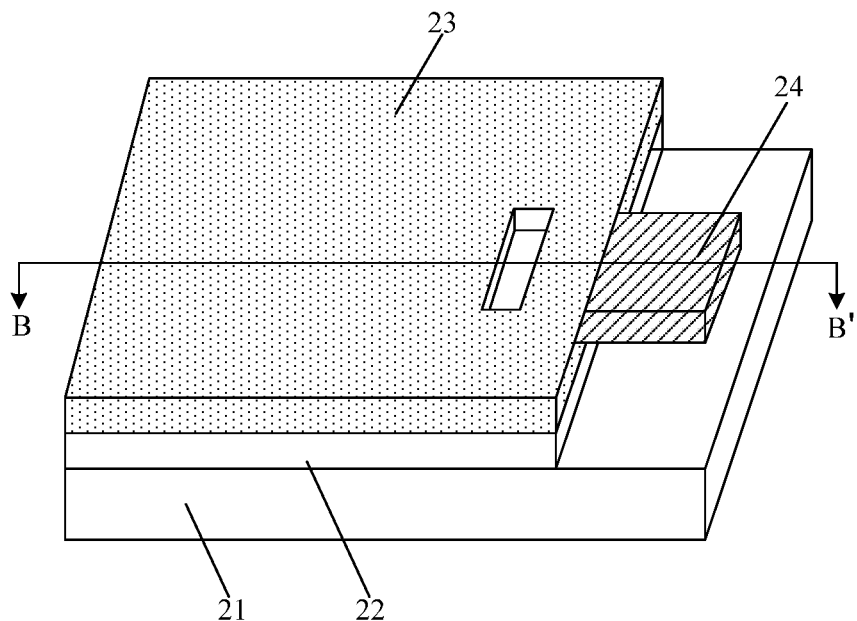
FIG. 7 is a perspective schematic view of a display device according to an embodiment of the present disclosure, in which a drive circuit plate is on an opposite substrate.

The array substrate 21 and the opposite substrate 22 are shown schematically in FIG. 3 and FIG. 7.

Figure 16:
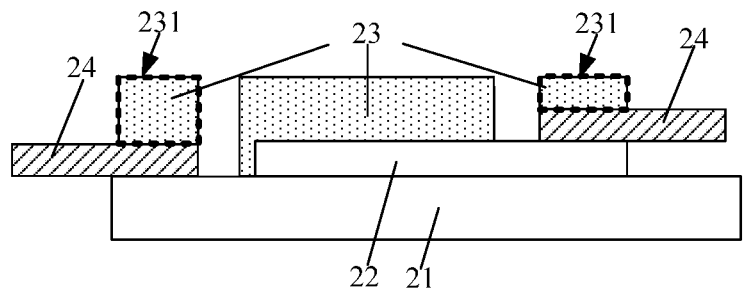
FIG. 16 is a side schematic view of a display device according to an embodiment of the present disclosure, in which drive circuit plates respectively located on the array substrate and the opposite substrate are shown.

As shown in FIGS. 3-6, the drive circuit plate 24 may be disposed on the side of the array substrate 21 close to the opposite substrate 22; or, as shown in FIGS. 7-10, the drive circuit plate 24 may be disposed on a side of the opposite substrate 22 away from the array substrate 21; or, as shown in FIG. 16, the number of the drive circuit plate 24 may be multiple, which may be disposed on both a side of the array substrate 21 close to the opposite substrate 22 and a side of the opposite substrate 22 away from the array substrate 21.

As shown in FIGS. 3-7, the light transmission layer 23 extends from the display region to above the drive circuit plate 24, that is, the light transmission layer 23 is a complete layer extending from the display region to the binding area.

In a direction from the display region to the binding area, the light transmission layer 23 may, completely or partially, cover a portion of the drive circuit plate 24 located in the binding area. For example, when the drive circuit plate 24 is disposed on the array substrate 21, an edge of the light transmission layer 23 does not extend beyond an edge of the array substrate 21; or, when the drive circuit plate 24 is disposed on the opposite substrate 22, the edge of the light transmission layer 23 does not extend beyond an edge of the opposite substrate 22.

The binding area is an area on the periphery of the display region and is used for binding wiring with the drive circuit plate 24.

The light transmission layer 23 may be fixed onto the drive circuit plate 24 or may only cover the drive circuit plate 24, which specifically depends on actual requirements of the process for preparing the light transmission layer 23 and products.

The light transmission layer 23 may function to fix the drive circuit plate 24 in consideration of the fact that the light transmission layer 23 is simultaneously fixed to the display panel and the drive circuit plate 24. Therefore, the light transmission layer 23 may be fixed to the display panel and the drive circuit plate 24 in the embodiments of the present disclosure.

The light transmission layer 23 may be directly fixed to the display panel and the drive circuit plate 24 in a bonding manner, that is, a surface on a side of the light transmission layer 23 at least close to the display panel is adhesive so that the light transmission layer 23 may be bonded to the display panel and the drive circuit plate 24, thereby fixing the drive circuit plate 24 onto the display panel.

The material of the light transmission layer 23 is not limited as long as it may transmit light and its light transmittance does not adversely affect the normal display of the display screen. Meanwhile, if the light transmission layer 23 is directly fixed to the display panel and the drive circuit plate 24 in a bonding manner, the surface on a side of the light transmission layer 23 at least close to the display panel and the drive circuit plate 24 is adhesive. For example, the material of the light transmission layer 23 may be an Optically Clear Adhesive (OCA for short).

Specifically, if the transmission layer 23 has other functions in addition to fixing the drive circuit plate 24 onto the display panel, the material of the light transmission layer 23 should also be related to the other functions.

For example, in the followings, the light transmission layer 23 may also be used as a polarizer, then, the material of the light transmission layer 23 should also be a material of the polarizer, in addition that the light transmission layer 23 is transparent and the surface on a side of the light transmission layer 23 at least close to the display panel is adhesive.

The shape of the opening is not limited. Specifically, the shape of the opening is related to the sidewall of the opening.

Figure 4:
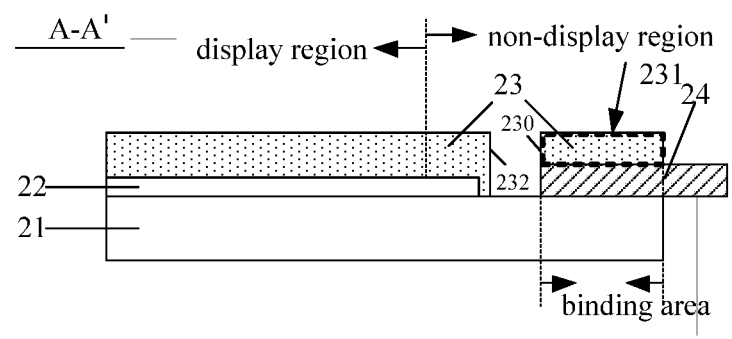
FIG. 4 is a sectional schematic view taken along line A-A' shown in FIG. 3.
Figure 8:
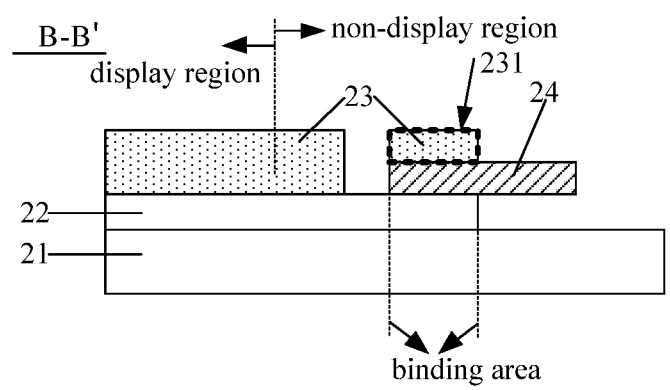
FIG. 8 is a sectional schematic view taken along line B-B' shown in FIG. 7.

As shown in FIG. 4 and FIG. 8, the first sidewall 230 of the opening away from the display region and the light-emitting surface of the display panel form an angle of 90°, while the second sidewall 232 of the opening opposing to the first sidewall 230 and the light-emitting surface of the display panel also form an angle of 90°.

Figure 5:
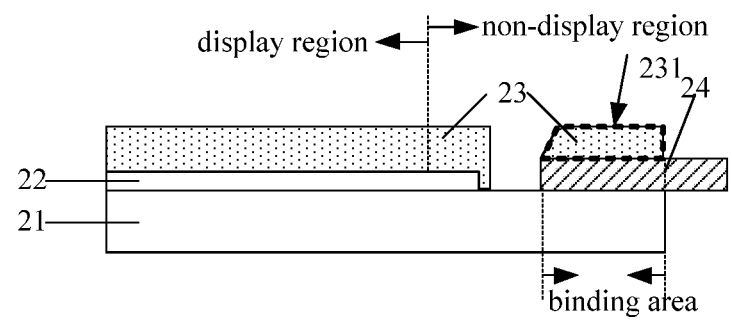
FIG. 5 is a side schematic view of a display device according to an embodiment of the present disclosure, in which a boundary of a first portion close to a display region is an inclined surface.
Figure 9:
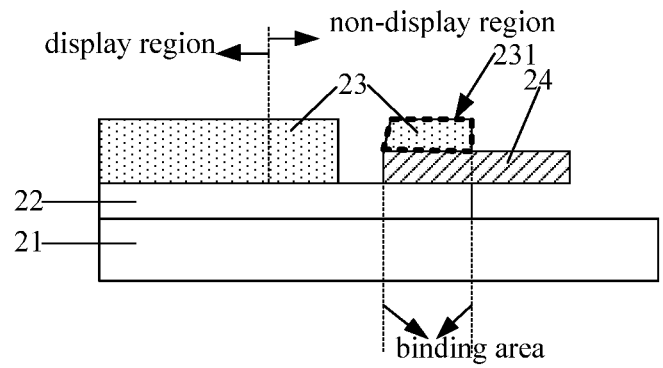
FIG. 9 is a side schematic view of a display device according to an embodiment of the present disclosure, in which a boundary of a first portion close to a display region is an inclined surface.

As shown in FIG. 5 and FIG. 9, the second sidewall 232 of the opening and the light-emitting surface of the display panel form an angle of 90°, and the first sidewall 230 is formed by a boundary of the first portion 231 of the light transmission layer 23 close to the display region, and is abutted a boundary of the drive circuit plate 24 close to the display region. The angle formed by the boundary of the drive circuit plate 24 close to the display region and the light-emitting surface of the display panel is usually 90°, and the angle formed by the boundary of the first portion 231 close to the display region and a light-emitting surface of the display panel is not 90°. An edge of the first portion 231 close to the display region may or may not extend beyond the boundary of the drive circuit plate 24 close to the display region. FIG. 5 and FIG. 9 show only situations where the edge of the first portion 231 close to the display region does not extend beyond the boundary of the drive circuit plate 24 close to the display region.

Figure 6:
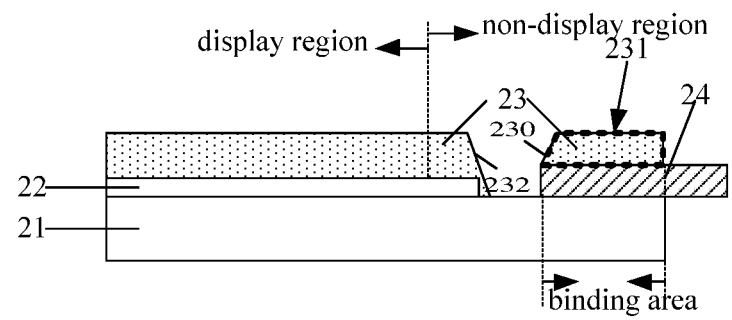
FIG. 6 is a side schematic view of a display device according to an embodiment of the present disclosure, in which a second sidewall of the opening is a bevel and a boundary of a first portion close to a display region is an inclined surface.
Figure 10:
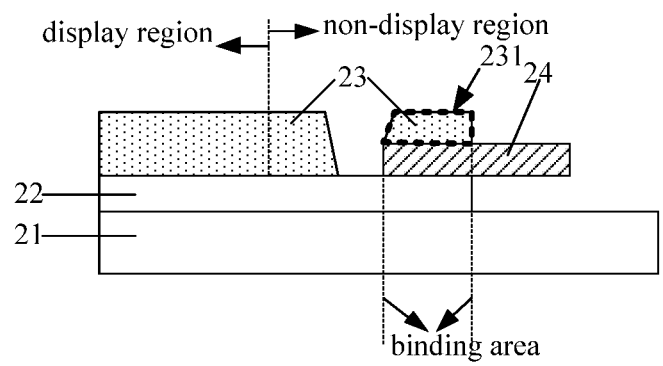
FIG. 10 is a side schematic view of a display device according to an embodiment of the present disclosure, in which a second sidewall of an opening is a bevel and a boundary of a first portion close to a display region is an inclined surface.

As shown in FIG. 6 and FIG. 10, the angle formed by the second sidewall 232 of the opening and the light-emitting surface of the display panel is not 90°, and the first sidewall 230 is formed by a boundary of the first portion 231 of the light transmission layer 23 close to the display region, and is abutted a boundary of the drive circuit plate 24 close to the display region. The angle formed by the boundary of the drive circuit plate 24 close to the display region and the light-emitting surface of the display panel is usually 90°, and the angle formed by the boundary of the first portion 231 close to the display region and a light-emitting surface of the display panel is not 90°.

As shown in FIG. 6 or FIG. 10, the second sidewall 232 is inclined in a direction away from the drive circuit plate 24. An edge of the first portion 231 close to the display region may or may not extend beyond the boundary of the drive circuit plate 24 close to the display region. FIG. 6 and FIG. 10 show only situations where the edge of the first portion 231 close to the display region does not extend beyond the boundary of the drive circuit plate 24 close to the display region.

For any one of the above embodiments, those skilled in the art will appreciate that in the case where the edge of the first portion 231 close to the display region extends beyond the boundary of the drive circuit plate 24 close to the display region, the first portion 231 cannot close the opening.

On the basis of the above, the sidewall abutted the first sidewall 230 and the second sidewall 232 in the opening may be in any shape, which is not limited according to the embodiments of the present disclosure. In order to simplify the preparation process, the angle formed by the first sidewall of the opening and the light-emitting surface of the display panel ranges from 45° to 135°.

Figure 11:
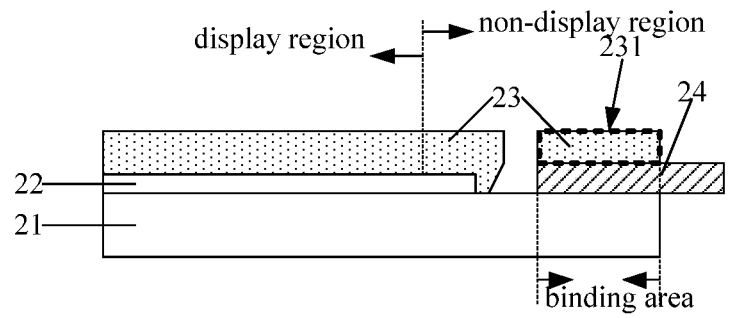
FIG. 11 is a side schematic view of a display device according to an embodiment of the present disclosure, in which a portion of a second sidewall of an opening is an inclined surface.

The direction from the non-display region to the display region is used as a width direction. The width of the opening is not limited in the embodiments of the present disclosure. As shown in FIGS. 4-6 and FIGS. 8-10, the width of the opening is greater than or equal to width of a projection of the bevel on the base substrate in the related art, that is, the light transmission layer 23 does not include the bevel; or, as shown in FIG. 11, the width of the light transmission layer 23 is smaller than width of the projection of the bevel on the base substrate in the related art.

The process of preparing the light transmission layer 23 is not limited, and specifically, it relates to the material of the light transmission layer 23, that is, the actual requirement of the product.

For example, the material of the light transmission layer 23 is OCA. The light transmission layer 23 with the opening may be formed by coating on the display panel and the drive circuit plate 24 to form a light transmission film, and then exposing and developing the light transmission film.

Alternatively, the material of the light transmission layer 23 is OCA. The light transmission layer 23 with the opening is formed in advance, and then the light transmission layer 23 with the opening is bonded onto the display panel and the drive circuit plate 24 by precise alignment.

Alternatively, the material of the light transmission layer 23 is SiNx or SiOx. The light transmission layer 23 with the opening may be formed by depositing on the display panel and the drive circuit plate 24 to form a light transmission film, and then exposing and developing and etching the light transmission film.

Of course, the light transmission layer 23 may also be formed in other manners, which is not limited according to the embodiments of the present disclosure.

In the display device according to embodiments of the present disclosure, the light transmission layer 23 on the display panel and the drive circuit plate 24 has an opening, and a sidewall of the opening are formed by the boundary of the drive circuit plate 24 close to the display region and the boundary of the first portion 231 of the light transmission layer 23 close to the display region. Since the opening has a certain width, the opening and the bevel in the related art are at least partially overlapped, that is, the presence of the opening causes a reduction of the width of the bevel in the related art, such that, in the case where the bevel still retains a partial width, the light incident on the bevel is reduced compared to that in the related art, thereby alleviating the light leakage problem of the display device, and in the case where a region where the bevel is located is completely formed as an opening, no large-angle light will be incident onto the bevel, and the light leakage problem of the display device caused by diffuse reflection of the large-angle light through the bevel may be completely avoided compared with that in the related art.

Figure 12:
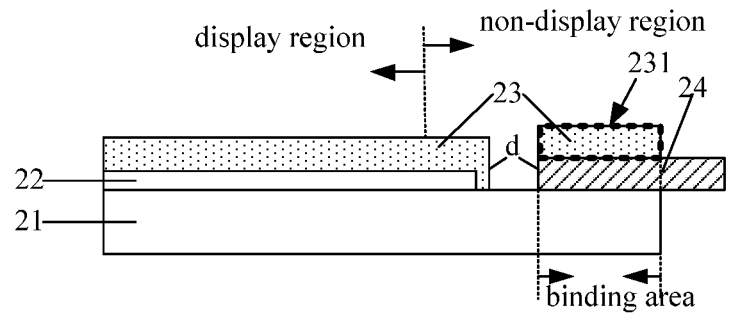
FIG. 12 is a side schematic view of a display device according to an embodiment of the present disclosure, in which a maximum width of an opening is shown.

Optionally, as shown in FIG. 12, between the sidewall of the opening close to the display region and the drive circuit plate 24, the opening has a maximum width d in the direction from the display region to the non-display region, the maximum width d ranging from about 0.25 mm to about 0.5 mm. Here, the expression "about" indicates the condition where there are manufacturing or assembly tolerances.

Here, the light transmission layer 23 with the opening may be formed in advance, and then the light transmission layer 23 with the opening is bonded onto the display panel and the drive circuit plate 24 by precise alignment. In this way, the bevel in the related art may be omitted.

Figure 13:
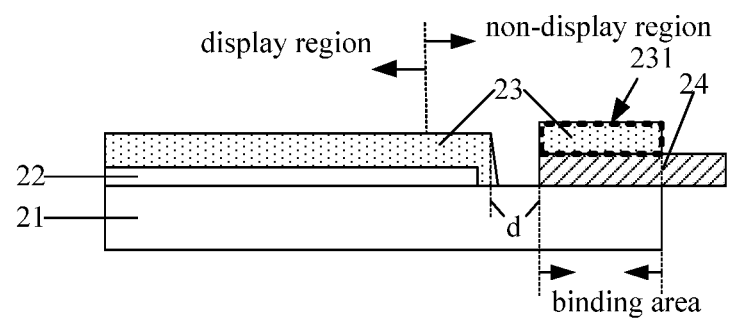
FIG. 13 is a side schematic view of a display device according to an embodiment of the present disclosure, in which a maximum width of an opening is shown and a second sidewall of an opening is an inclined surface.

It should be noted that, "the opening has a maximum width d in the direction from the display region to the non-display region, the maximum width d ranging from about 0.25 mm to about 0.5 mm" indicates that, as shown in FIG. 12, if the angle formed by the second sidewall 232 and the light-emitting surface of the display panel is 90°, a vertical distance between any position on the second sidewall 232 and the side surface of the drive circuit plate 24 always is d; as shown in FIG. 13, the angle formed by the second sidewall 232 and the light-emitting surface of the display panel is not 90°, and a distance between a portion of the second sidewall 232 that is farthest from the side surface of the drive circuit plate 24 and the drive circuit plate 24 is d, and distances between the other portions of the second sidewall 232 and the side surface of the drive circuit plate 24 always are less than d.

As shown in FIG. 1 and FIG. 2, since the FPC 12 and the bonding layer 13 have a certain thickness, if an entire bonding layer 13 is directly formed, the bubble line problem may occur at the portion of the bonding layer 13 that is in direct contact with the display panel and is closest to the non-display region. After being incident onto the bubbles and diffusely reflected by the bubbles, the large-angle light diffusely reflected by the bubble may also be emitted from a region within the visible area other than the operable region, thereby causing a light leakage phenomenon. Moreover, after being incident onto the bevel, some of the large-angle light may be reflected through the bevel to the region within the visible area other than the operable region, thereby further causing light leakage phenomenon.

Figure 14:
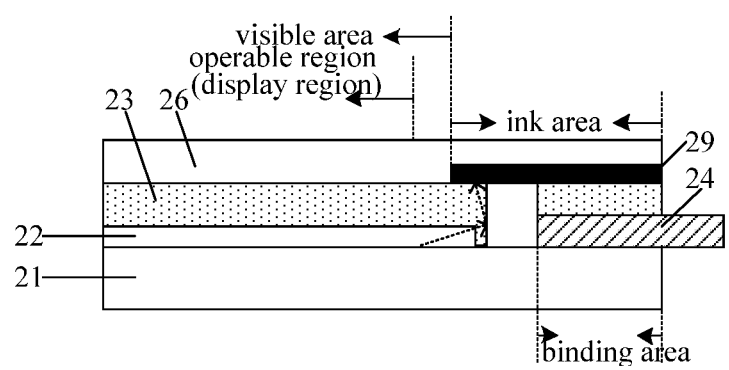
FIG. 14 is a side schematic view of a display device according to an embodiment of the present disclosure, in which a light shielding layer is shown.

Based on the above, according to the embodiments of the present disclosure, a light transmission layer 23 with the opening is directly formed on the display panel and the drive circuit plate 24, so that the light transmission layer 23 is accurately aligned with the display panel and the drive circuit plate 24, instead of formation of the light transmission layer 23 by forming a light transmission film on the display panel and the drive circuit plate 24 and then patterning the light transmission film. In this way, the problem in the related art that the light transmission layer 23 and the drive circuit plate 24 are not completely fitted to each other due to the climbing may be avoided. The light leakage problem caused by the bubble line and the light leakage phenomenon caused by reflection of the light through the bevel to the region within the visible area other than the operable region in the related art are eliminated. In addition, since the maximum width d between the second sidewall 232 of the opening and the circuit plates 24 may be controlled in the range of about 0.25 mm to about 0.5 mm, on one hand, compared to the width of the projection of the bevel on the flexible base substrate being 0.6 mm to 1 mm, less light is incident on the second sidewall 232 of the opening, and accordingly less light is reflected by the second sidewall 232, thereby alleviating the light leakage problem of the display device; on the other hand, compared to the distance from the edge of the bevel contacting the display panel to the display region in the related art, the distance between the second sidewall 232 and the display region is larger. As a result, as shown in FIG. 14, after being reflected by the second sidewall 232, the light originally emitted from the region within the visible area other than the operable region in the related art will be absorbed by the light shielding layer 29 in the ink area, thereby alleviating the light leakage problem of the display device (the dotted arrow in FIG. 14 is a path of the light in the display device).

Figure 15:
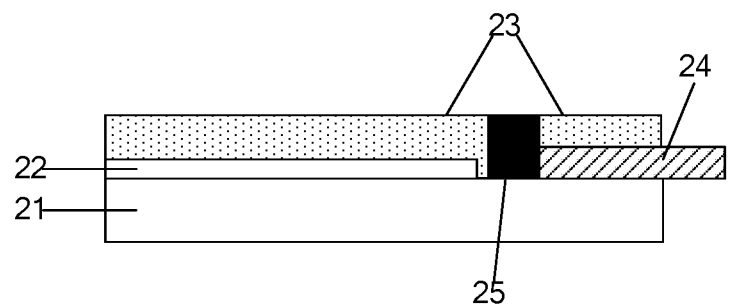
FIG. 15 is a side schematic view of a display device according to an embodiment of the present disclosure, in which a light shielding structure filled in an opening is shown.

Optionally, as shown in FIG. 15, the opening is filled therein with a light shielding structure 25.

It should be noted that, the material of the light shielding structure 25 is not limited. For example, the material of the light shielding structure 25 may be a resin doped with a black pigment.

The surface of the light shielding structure 25 facing away from the display panel may be flush with the surface of the light transmission layer 23 facing away from the display panel, or may be lower than the surface of the light transmission layer 23 facing away from the display panel. Optionally, the surface of the light shielding structure 25 faces away from the display panel is flush with the surface of the light transmission layer 23 facing away from the display panel.

In the embodiments of the present disclosure, the light shielding structure 25 in the opening may absorb the light that is incident onto the second sidewall 232 of the opening, and the absorbed light may no longer be diffusely reflected, especially in the case where the surface of the light shielding structure 25 facing away from the display panel is flush with the surface of the light transmission layer 23 facing away from the display panel, the light shielding structure 25 may completely absorb the light that is incident on the second sidewall 232, thereby avoiding the light leakage problem of the display device.

Optionally, as shown in FIG. 16, in the case where the drive circuit plates 24 are disposed on both the array substrate 21 and the opposite substrate 22, the array substrate 21 and the opposite substrate 22 share (are covered by) one same light transmission layer 23. The drive circuit plate 24 on the array substrate 21 and the drive circuit plate 24 on the opposite substrate 22 are respectively located on opposite sides of the display panel.

Here, the light transmission layer 23 on the array substrate 21 comprises a portion that is on the side of the drive circuit plate 24(left) facing away from the array substrate 21, a portion that is directly on the array substrate 21, a portion that is on the side of the drive circuit plate 24(right) facing away from the package substrate 22, and a portion that is directly on the package substrate 22.

It should be noted that, as shown in FIG. 16, the drive circuit plate 24 on the array substrate 21 and the drive circuit plate 24 on the opposite substrate 22 are respectively located on opposite sides of the display panel. The drive circuit plate 24 on the array substrate 21 and the drive circuit plate 24 on the opposite substrate 22 may also be located on adjacent sides of the display panel.

Surfaces of the display panel except for the light-emitting surface and the surface opposite to the light-emitting surface are named as side surfaces, and portions of the display panel where the side surfaces are located are named as side portions of the display panel.

In the embodiments of the present disclosure, in the case where the drive circuit plates 24 are provided on both the array substrate 21 and the opposite substrate 22, the cost of preparing the display device may be saved by sharing one same light transmission layer 23.

Optionally, in the case where the drive circuit plate 24 is disposed on the opposite substrate 22, or where the drive circuit plates 24 are disposed on both the array substrate 21 and the opposite substrate 22, the light transmission layer 23 is a polarizer, or an optical transparent adhesive.

In the embodiments of the present disclosure, since the polarizer is usually disposed on the side of the opposite substrate 22 facing away from the array substrate 21, the light transmission layer 23 may also be used as a polarizer to reduce the thickness of the display device; or the display device further includes a cover plate. The cover plate may be bonded to other structures (such as a display panel) by an optical transparent adhesive, so that the light transmission layer 23 may be used not only for fixing the drive circuit plate 24 but also for bonding the cover plate.

Figure 17:
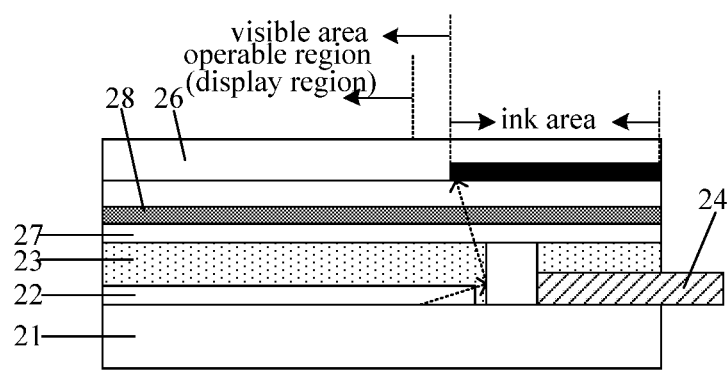
FIG. 17 is a side schematic view of a display device according to an embodiment of the present disclosure, in which a touch structure and a polarizer are shown.

Of course, when the light transmission layer 23 is not used as a polarizer, as shown in FIG. 17, the polarizer 28 is disposed on the side of the light transmission layer 23 facing away from the display panel.

Optionally, referring to FIG. 14, the display device further includes a rigid fixation layer 26 disposed on a side of the light transmission layer 23 facing away from the drive circuit plate 24.

It should be noted that, the material of the rigid fixation layer 26 is not limited. In order not to adversely affect the normal display of the display device, the rigid fixation layer 26 should be a high-hardness light-transmitting material.

The rigid fixation layer 26 may be a cover plate in a display device, such as a glass cover plate. By using a cover plate in the display device as the rigid fixation layer 26, the manufacturing cost of the display device may be saved and the thickness of the display device may be reduced.

In the embodiments of the present disclosure, the rigid fixation layer 26 is on the side of the light transmission layer 23 facing away from the drive circuit plate 24. When the light transmission layer 23 is used to fix the drive circuit plate 24, the drive circuit plate 24 may be further fixed on the display panel through the light transmission layer 23.

Further, the display panel is a flexible OLED display panel. In the flexible OLED display panel, both the opposite substrate 22 and the base substrate of the array substrate 21 are of flexible materials, which may be, for example, polyimide (Polyimide, PI for short).

In the embodiments of the present disclosure, in the case where the display panel is a flexible OLED display panel, the drive circuit plate 24 may be further fixed by providing a rigid fixation layer 26 on the side of the light transmission layer 23 facing away from the drive circuit plate 24, thereby avoiding the flexible OLED display panel being deformed as the drive circuit plate 24 is bent.

Figure 18:
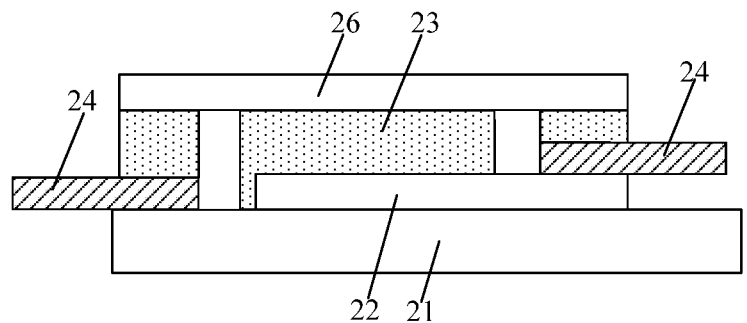
FIG. 18 is a side schematic view of a display device according to an embodiment of the present disclosure, in which an array substrate, an opposite substrate and drive circuit plate share a rigid fixation layer.

Further, as shown in FIG. 18, in the case where drive circuit plates 24 are provided on both the array substrate 21 and the opposite substrate 22, the array substrate 21 and the opposite substrate 22 share (are covered by) one same rigid fixation layer 26. On the side portion of the display panel, the drive circuit plate 24 on the array substrate 21 and the drive circuit plate 24 on the opposite substrate 22 are respectively located on opposite sides of the display panel.

Here, the rigid fixation layer 26 on the array substrate 21 comprises a portion that is above the side of the drive circuit plate 24 facing away from the array substrate 21, a portion that is above the array substrate 21, a portion that is above the package substrate 22, and a portion that is above the side of the drive circuit plate 24 facing away from the package substrate 22.

It should be noted that, in the case where the array substrate 21 and the opposite substrate 22 share (are covered by) one same rigid fixation layer 26, the array substrate 21 and the opposite substrate 22 may or may not share(be covered by) one same light transmission layer 23. FIG. 18 only shows the sharing situation of the light transmission layer 23.

The drive circuit plate 24 on the array substrate 21 and the drive circuit plate 24 on the opposite substrate 22 are respectively located on opposite sides of the display panel. The drive circuit plate 24 on the array substrate 21 and the drive circuit plate 24 on the opposite substrate 22 may also be respectively located on adjacent sides of the display panel.

In the embodiments of the present disclosure, in the case where drive circuit plates 24 are provided on both the array substrate 21 and the opposite substrate 22, the cost of preparing the display device may be saved by sharing one same rigid fixation layer 26.

Optionally, as shown in FIG. 17, the display device further includes a touch structure 27, and the touch structure 27 is on the side of the opposite substrate 22 away from the array substrate 21, that is, an on-cell touch is provided. The touch structure 27 is electrically connected to the drive circuit plate 24 on the opposite substrate 22.

The touch structure 27 includes a touch electrode and a lead for touch electrode.

In the embodiments of the present disclosure, when the touch structure 27 is on the side of the opposite substrate 22 facing away from the array substrate 21, the touch structure 27 is electrically connected to the drive circuit plate 24 on the opposite substrate 22, so as to control the touch structure 27.

Figure 19:
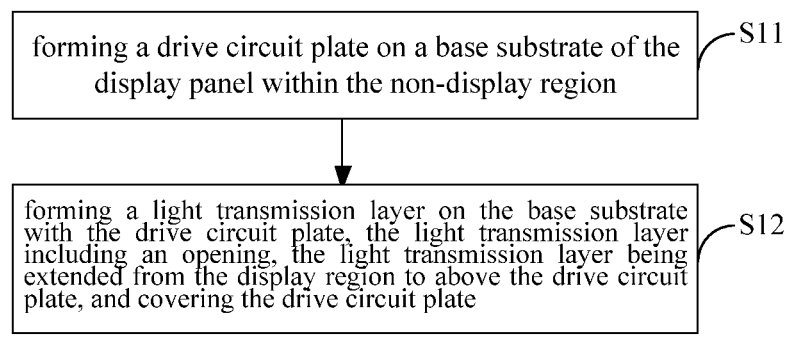
FIG. 19 is a schematic flow diagram of a method of manufacturing a display device according to an embodiment of the present disclosure.

According to the embodiments of the present disclosure, there is provided a method of manufacturing a display panel. The display panel is a flexible display panel comprising a display region and a non-display region, the non-display region including a binding area. As shown in FIG. 19, the method may comprise the following steps.

Figure 20:
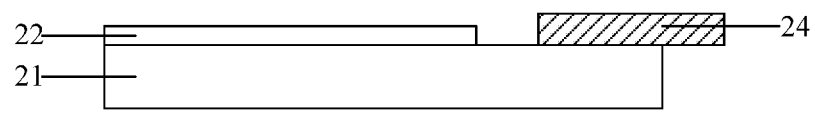
FIG. 20 is a schematic view of a process for manufacturing a display device according to an embodiment of the present disclosure.

In a step of S11, as shown in FIG. 20, forming a drive circuit plate 24 on a base substrate of the display panel, and the drive circuit plate 24 is within the binding area.

It should be noted that the base substrate of the display panel may be the base substrate of the array substrate 21 or the base substrate of the opposite substrate 22.

In a step of S12, as shown in FIGS. 4-6, 8-10 and 13, forming a light transmission layer 23 on the base substrate where the drive circuit plate 24 is formed, the light transmission layer 23 includes an opening, and the light transmission layer 23 extends from the display region to above the drive circuit plate 24 and covers the drive circuit plate 24

The portion of the light transmission layer 23 on the drive circuit plate 24 is named as a first portion 231, the opening is on a side of the drive circuit plate 24 close to the display region, and the first sidewall 230 of the opening is formed by a boundary of the first portion 231 close to the display region, and is abutted a boundary of the drive circuit plate 24 close to the display region.

For explanations and descriptions of the method of manufacturing the display panel, reference may be made to the explanations and descriptions of the display panel according to the foregoing embodiments, and the details are not described herein again.

In the method of manufacturing a display panel according to embodiments of the present disclosure, the light transmission layer 23 disposed on the display panel and the drive circuit plate 24 has the opening, and a sidewall of the opening is formed by the boundary of the first portion 231 close to the display region and is abutted the boundary of the drive circuit plate 24 close to the display region. Since the opening has a certain width, the opening and the bevel in the related art are at least partially overlapped, that is, the presence of the opening causes a reduction of the width of the bevel in the related art, such that, in the case where the bevel still retains a partial width, the light incident on the bevel is reduced compared to that in the related art, thereby alleviating the light leakage problem of the display device, and in the case where a region where the bevel is located is completely formed as an opening, no large-angle light will be incident onto the bevel, and the light leakage problem of the display device caused by diffuse reflection of the large-angle light through the bevel may be completely avoided compared with that in the related art.

Optionally, between the sidewall of the opening close to the display region and the drive circuit plate 24, the opening has a maximum width d in the direction from the display region to the non-display region, the maximum width d ranging from about 0.25 mm to about 0.5 mm. The step of forming a light transmission layer 23 on the base substrate with the drive circuit plate 24 comprises: bonding the light transmission layer 23 with the opening onto the base substrate with the drive circuit plate 24.

Here, the light transmission layer 23 with the opening may be formed in advance, and then the light transmission layer 23 with the opening is bonded onto the display panel and the drive circuit plate 24 by precise alignment. In this way, the bevel in the related art may be omitted.

It should be noted that, "between the second sidewall of the opening and the drive circuit plate 24, the opening has a maximum width d in the direction from the display region to the non-display region, the maximum width d ranging from about 0.25 mm to about 0.5 mm" indicates that, as shown in FIG. 12, if the angle formed by the second sidewall 232 and the light-emitting surface of the display panel is 90°, a perpendicular distance between any position on the second sidewall 232 and the side surface of the drive circuit plate 24 always is d; as shown in FIG. 13, the angle formed by the second sidewall 232 and the light-emitting surface of the display panel is not 90°, and a perpendicular distance between a portion of the second sidewall 232 that is farthest from the side surface of the drive circuit plate 24 and the drive circuit plate 24 is d, and perpendicular distances between the other portions of the second sidewall 232 and the side surface of the drive circuit plate 24 always are less than d.

As shown in FIG. 1 and FIG. 2, since the FPC 12 and the bonding layer 13 have a certain thickness, if an entire bonding layer 13 is directly formed, the bubble line problem may occur at the portion of the bonding layer 13 that is in direct contact with the display panel and is closest to the non-display region. After being incident onto the bubbles and diffusely reflected by the bubbles, the large-angle light diffusely reflected by the bubble may also be emitted from a region within the visible area other than the operable region, thereby causing a light leakage phenomenon. Moreover, after being incident onto the bevel, some of the large-angle light may be reflected through the bevel to the region within the visible area other than the operable region, thereby further causing light leakage phenomenon.

Based on the above, according to the embodiments of the present disclosure, a light transmission layer 23 with the opening is directly formed on the display panel and the drive circuit plate 24, so that the light transmission layer 23 is accurately aligned with the display panel and the drive circuit plate 24, instead of formation of the light transmission layer 23 by forming a light transmission film on the display panel and the drive circuit plate 24 and then patterning the light transmission film. In this way, the problem in the related art that the light transmission layer 23 and the drive circuit plate 24 are not completely fitted to each other due to the climbing may be avoided. The light leakage problem caused by the bubble line and the light leakage phenomenon caused by reflection of the light through the bevel to the region within the visible area other than the operable region in the related art are eliminated. In addition, since the maximum width d between the second sidewall 232 of the opening and the circuit plates 24 may be controlled in the range of about 0.25 mm to about 0.5 mm, on one hand, compared to the width of the projection of the bevel on the flexible base substrate in the related art being 0.6 mm to 1 mm, less light is incident on the second sidewall 232 of the opening, and accordingly less light is reflected by the second sidewall 232, thereby alleviating the light leakage problem of the display device; on the other hand, compared to the distance from the edge of the bevel contacting the display panel to the display region in the related art, the distance between the second sidewall 232 and the display region is larger. As a result, as shown in FIG. 14, after being reflected by the second sidewall 232, the light originally emitted from the region other than the operable region within the visible area in the related art will be absorbed by the light shielding layer 29 in the ink area, thereby alleviating the light leakage problem of the display device (the dotted arrow in FIG. 14 is a path of the light in the display device).

Optionally, as shown in FIG. 15, the method further comprises: filling the opening with a light shielding structure 25.

It should be noted that, the material of the light shielding structure 25 is not limited. For example, the material of the light shielding structure 25 may be a resin doped with a black pigment.

The surface of the light shielding structure 25 facing away from the display panel may be flush with the surface of the light transmission layer 23 facing away from the display panel, or may be lower than the surface of the light transmission layer 23 facing away from the display panel. Optionally, the surface of the light shielding structure 25 faces away from the display panel is flush with the surface of the light transmission layer 23 facing away from the display panel.

The way to fill the light shielding structure 25 is not limited. Specifically, the material of the light shielding structure 25 is different, and the filling method is also different. For example, the light shielding structure 25 may be filled into the opening by deposition.

In the embodiments of the present disclosure, the light shielding structure 25 in the opening may absorb the light that is incident onto the second sidewall 232 of the opening, and the absorbed light may no longer be diffusely reflected, especially in the case where the surface of the light shielding structure 25 facing away from the display panel is flush with the surface of the light transmission layer 23 facing away from the display panel, the light shielding structure 25 may completely absorb the light that is incident on the second sidewall 232, thereby avoiding the light leakage problem of the display device.

The above are only the specific embodiments of the present disclosure, but the scope of the present disclosure is not limited thereto, and any variations or replacements easily conceived by those skilled in the art should be within the protective scope of the present disclosure. Therefore, the protective scope of the present disclosure should be determined by the scope of the pending claims.

The invention claimed is:
1. A display device comprising:
a display panel having a display region and a non-display region that are divided in a plane where a light-emitting surface of the display panel is located;
a drive circuit plate being disposed on the non-display region; and
a light transmission layer which is extended from the display region to above the drive circuit plate within the non-display region, and which has an opening, the opening being adjacent to a boundary of the drive circuit plate close to the display region and being disposed on a side of the drive circuit plate close to the display region,
wherein the opening has a first sidewall that abuts a side surface of the drive circuit plate close to the display region, and
wherein the display panel comprises, in a thickness direction, an array substrate and an opposite substrate on the array substrate, wherein the drive circuit plate is on the array substrate and is spaced from the opposite substrate on a side of the opposite substrate away from the display region, and the light transmission layer is extended from the opposite substrate to above the drive circuit plate and completely covers a boundary of the opposite substrate close to the display region.
2. The display device of claim 1, wherein the opening has a maximum width ranged from about 0.25 mm to about 0.5 mm in a direction from the display region to the non-display region.

3. The display device of claim 1, wherein the first sidewall of the opening and the light-emitting surface of the display panel form an angle ranging from 45° to 135°.

4. The display device of claim 1, wherein the opening is filled therein with a light shielding structure.

5. The display device of claim 1, wherein the opening has a second sidewall that is close to a boundary of the opposite substrate close to the drive circuit plate, and at least a portion of the second sidewall is inclined with respect to the light-emitting surface of the display panel.

6. The display device of claim 5, wherein, in a direction from the display region to the non-display region, the opposite substrate is opposite to the drive circuit plate, and the first sidewall of the opening is opposite to the second sidewall.

7. The display device of claim 5, wherein, in a direction from the display region to the non-display region, the opening has a second sidewall that is opposite to the first sidewall, and at least a portion of the second sidewall is inclined with respect to the light-emitting surface of the display panel.

8. The display device of claim 1, wherein the display panel comprises, in a thickness direction, an array substrate and an opposite substrate on the array substrate, wherein the drive circuit plate is on the opposite substrate, and the light transmission layer is extended from the opposite substrate to above the drive circuit plate.

9. The display device of claim 8, wherein the light transmission layer is a polarizer, or the light transmission layer is an optical transparent adhesive.

10. The display device of claim 1, wherein the display panel comprises, in a thickness direction, an array substrate and an opposite substrate on the array substrate; the display panel further comprising two said drive circuit plates and two said openings, wherein one drive circuit plate of the two drive circuit plates is on the opposite substrate, the other drive circuit plate of two drive circuit plates is on the array substrate and is spaced from the opposite substrate; the light transmission layer is extended above the array substrate, the opposite substrate and the drive circuit plates and completely covers a boundary of the opposite substrate close to the other drive circuit plate.

11. The display device of claim 10, wherein the one drive circuit plate on the opposite substrate and the other drive circuit plate on the array substrate are located on opposite sides of the display panel.

12. The display device of claim 10, wherein the light transmission layer is a polarizer, or the light transmission layer is an optical transparent adhesive.

13. A method of manufacturing a display device comprising a display panel having a display region and a non-display region that are divided in a plane where a light-emitting surface of the display panel is located, the method comprising steps as follows:
    forming a drive circuit plate within the non-display region of a base substrate of the display panel; and
    forming a light transmission layer which is extended from the display region to above the drive circuit plate within the non-display region and has an opening, the opening being adjacent to a boundary of the drive circuit plate close to the display region and being disposed on a side of the drive circuit plate close to the display region, wherein the opening has a first sidewall that is abutted a side surface of the drive circuit plate close to the display region,
    wherein the display panel is formed to comprise, in a thickness direction, an array substrate and an opposite substrate on the array substrate, wherein the drive circuit plate is on the array substrate and is spaced from the opposite substrate on a side of the opposite substrate away from the display region, the light transmission layer is extended from the opposite substrate to above the drive circuit plate and completely covers a boundary of the opposite substrate close to the display region.

14. The method of claim 13, wherein forming a light transmission layer comprises:
    bonding the light transmission layer with the opening onto the base substrate with the drive circuit plate.

15. The method of claim 13, wherein forming a light transmission layer comprises:
    forming, by a coating process or a deposition process, a light transmission film on the base substrate with the drive circuit plate, and then, exposing and developing the light transmission film to form the opening.

16. The method of claim 13, wherein the opening has a maximum width ranged from about 0.25 mm to about 0.5 mm in a direction from the display region to the non-display region.

17. The method of claim 13, further comprising:
    filling the opening with a light shielding structure.

* * * * *